United States Patent [19]
Burke et al.

[11] Patent Number: 5,618,461
[45] Date of Patent: Apr. 8, 1997

[54] REFLECTANCE METHOD FOR ACCURATE PROCESS CALIBRATION IN SEMICONDUCTOR WAFER HEAT TREATMENT

[75] Inventors: Robert J. Burke; Russell C. Zahorik; Paul A. Paduano; Randhir P. S. Thakur, all of Boise, Id.

[73] Assignee: Micron Technology, Inc., Boise, Id.

[21] Appl. No.: 346,764

[22] Filed: Nov. 30, 1994

[51] Int. Cl.$^6$ .................................................. H05B 1/02
[52] U.S. Cl. .................... 219/502; 219/121.83; 219/506; 374/161; 374/129
[58] Field of Search .................... 219/121.43, 121.83, 219/502, 497, 506, 481, 508; 374/7, 161, 121, 127, 123, 129

[56] References Cited

U.S. PATENT DOCUMENTS

| | | | |
|---|---|---|---|
| 4,984,902 | 1/1991 | Crowley et al. | 374/1 |
| 4,984,903 | 1/1991 | Sweeney | 374/123 |
| 5,249,142 | 9/1993 | Shirakawa et al. | 364/557 |
| 5,364,187 | 11/1994 | Thakur et al. | 374/161 |
| 5,490,728 | 2/1996 | Schietinger et al. | 374/7 |

OTHER PUBLICATIONS

G. Harbeke et al., "Rapid Characterization of Polysilicon Films by Means of a UV Reflectometer," RCA Review vol. 44, Mar. (1983).

*Primary Examiner*—Mark H. Paschall
*Attorney, Agent, or Firm*—Workman, Nydegger & Seeley

[57] ABSTRACT

A nondestructive product level calibration method which is based on reflectance of intensity of UV and visible light that is measured from the top surface of a semiconductor wafer in a RTP closed loop process control environment in which the temperature of the wafer is regulated as a function of reflectivity of radiation at a preselected wavelength from the top surface of the wafer. In the method, sheet resistance of the wafer is measured as a function of the intensity of the UV and IR light directed at the wafer over a predetermined temperature and time range. Then, the reflectance intensity off wafer is measured to develop a model of the top surface. The reflectance model will indicate a wavelength where the reflectance is the greatest. Next, the wafer is subjected to UV radiation at the most sensitive wavelength and the reflectance is plotted against intensity of heat treatment. Then, notice is taken that the reflectance detected directly corresponds to a ratio of temperature over time measured in the first step. Thus, the reflectance at a particular wavelength of UV light corresponds to a specific and discrete temperature so that the degree of heat treatment to which the wafer has been exposed is known.

29 Claims, 6 Drawing Sheets

REFLECTANCE METHOD FOR ACCURATE PROCESS CALIBRATION IN SEMICONDUCTOR WAFER HEAT TREATMENT

1. FIELD OF THE INVENTION

This invention relates to a method for accurately measuring the temperature of an object, such as a wafer in heat treatment, using the amplified measurement signal of reflected light, preferably ultraviolet or visible light, at a predetermined wavelength from the surface of the wafer. The method described is ideally suited for measuring the reflectance of an object processed in rapid thermal processing (RTP) equipment.

2. BACKGROUND OF THE INVENTION

Techniques that allow for rapid and precise, nondestructive parametric measurements are in high demand in the semiconductor industry. Due to the increasing market for semiconductor devices, high volume production is a pressing requirement of semiconductor manufacturers. High volume production presents a challenge in today's technology which requires complicated designs of complex semiconductors. Particularly challenging is the quality control aspect of such high volume manufacturing. Parametric measurements become increasingly important in order to properly and accurately manufacture complex semiconductor designs. Such parameters include counts of impurities, and atmospheric factors including humidity, temperature, and pressure which can directly affect the quality of the manufactured semiconductor as well as the processing time and yield of the manufactured product.

The demands for rapid production of semiconductors adhering to a strict quality control standards often involve differing objectives, all of which must be matched in order to produce a quality product at a high rate and at a relatively low price per part. Balancing these objectives is paramount in order to be competitive in the current semiconductor marketplace.

Producing semiconductor parts at an ever-increasing rate becomes increasingly important as the price per pan is further reduced. Thus, advances in increasing production speed are greatly sought after. A significant amount of time is used in quality control testing during the manufacturing process, particularly where the production rate must be halted or otherwise ceased while such quality control testing takes place. It would be an advance in the art to provide such testing during the production process without halting the forward progress of the processing steps. By simultaneously conducting both manufacturing and quality control steps, the overall throughput and the production volume rate are enhanced. Parametric measurement techniques which can be used during production steps are thus desirable.

Temperature measurement of wafers in semiconductor manufacturing, as presently known in Rapid Thermal Processing (RTP), does not lend itself to the aforedescribed objectives. Thermocouple temperature measurement is impractical at high volume production because it involves direct contact and instrumenting of the wafer. Thus, it is destructive, expensive, and not very repeatable.

The calibration technique of pyrometry involves heating a sample to a known temperature and involves setting the temperature output by the pyrometer according to the temperature. This calibration technique is somewhat inaccurate because of the emissivity variation of the backside of a semiconductor and it is difficult and challenging to obtain consistent results therefrom.

Pyrometric measurement of wafer temperature is a very strong function of wafer emissivity and has an induced drift in temperature such that accuracy and repeatability of temperature measurement is very difficult to accomplish. Ion deposition and plasma etching steps in wafer fabrication processes do not lend themselves to temperature measurement techniques currently being used, and these techniques are particularly problematic when being used in situ.

It is desirable to have a closed loop temperature control mechanism such that the temperature in heat treatment of wafers during manufacturing can be adjusted according to a feedback of how wafers are being affected during the heat treatment. Accordingly, it would be advantageous to derive a temperature measurement and calibration technique which is nondestructive, non-contact, accurate, and unobtrusive in the environments known to wafer processing systems, such as vacuum environments. The reflectance method proposed in the current invention meets all these criteria and is very suitable in production environments.

SUMMARY AND OBJECTS OF THE INVENTION

It is an object of the present invention to measure reflectance of a wafer in an RTP process using a method that overcomes the foregoing problems known to RTP processing of wafers.

It is a further object of this present invention to provide a system for measuring the reflectance of wafers in an RTP process that will function in a vacuum environment and will not involve contacting wafers in a destructive testing procedure, while being accurate and functioning without disrupting the RTP manufacturing process.

It is a still further object of the present invention to provide a closed loop process control environment for RTP wafer processing in which the temperature of the wafer is regulated as a function of reflectivity of radiation at a preselected wavelength from the top surface of the wafer.

The foregoing objectives are achieved via a nondestructive product level calibration method which is based on reflectance of intensity of ultraviolet (UV) and visible light that is measured from the top surface of a semiconductor wafer in a RTP processing furnace. The top surface of the semiconductor wafer can be planar and therefore specular in nature, or can be patterned and therefore diffuse in nature. This calibration process is accomplished through four (4) manipulative steps as described below.

In the first calibration step, sheet resistance of the wafer is measured as a function of the intensity of the UV light and infrared (IR) light directed at the wafer over a predetermined temperature and time range.

In the second calibration step, the reflectance intensity off the surface of the wafer is measured at several points on the top surface of the wafer to develop a model of the reflectance of the total top surface of the wafer for a particular process step. The reflectance model will indicate a region of the extracted spectrum as a function of wavelength on the top surface of the wafer where the change in reflectance is greatest. In order to accomplish this reflectance model, two (2) substeps in the derivation of the reflectance model are required. A description of these two (2) substeps follows.

In the first substep in the derivation of the reflectance model, the top surface of the semiconductor wafer is subjected to UV light at a range of wavelengths and reflectance measurements are taken therefrom at selected most sensitive wavelengths which is a function of the type of film annealed. The range in wavelengths to which the semiconductor wafer is subjected is at least 80 nm and above. Other preferable ranges include 250 nm to 800 nm, and approximately 80 nm–100 nm.

The second substep in the derivation of the reflectance model is to derive from the reflectance measurements the wavelength that is most sensitive to changes in reflectance. Stated otherwise, the highest change in reflectance will indicate the preferred reference wavelength. The preferred reference wavelength is the wavelength at which all future measurements of reflectance are to be made.

The third calibration step in calibrating the temperature of the wafers is to subject the wafer to radiation at the reference wavelength at a variety of intensity ranges of the UV light. The reflectance of the UV light off the top of the surface of the wafer is to be plotted as a function of the intensity.

The fourth calibration step is performed after the reflectance versus intensity at the reference wavelength plot has been made. In the fourth calibration step, notice is taken that the reflectance detected in the third calibration step directly corresponds to a ratio of temperature over time measured in the first calibration step. Thus, the reflectance at a particular wavelength of UV light corresponds to a specific and discrete temperature.

The foregoing method can be conducted in situ to measure semiconductor wafer reflectivity during the semiconductor wafer heat treatment production process, including an RTP heat source, resistance heating, plasma heating, or laser annealing.

Reflectance measurements of UV light can be periodic and ongoing while the semiconductor wafer is hem-treated. A process controller mechanism can be integral to a closed loop system to regulate and adjust the heat treatment as a function of the measured reflectivity. Of course, reflectivity can also be measured before or after wafer heat treatment, and can be measured both inside and outside vacuum chambers.

If the foregoing calibration method for temperature is to be accurate for measurements on different wafers, the wafers must be similar in material and geometry. The closer that the parameters of materials and geometry correspond between wafers, the more accurately the calibration measurements will correspond to other wafers. Therefore, it is preferable in production of semiconductor wafers that the semiconductor wafers are uniform. Preferable, the semiconductor wafers are single crystal wafers.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawing depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
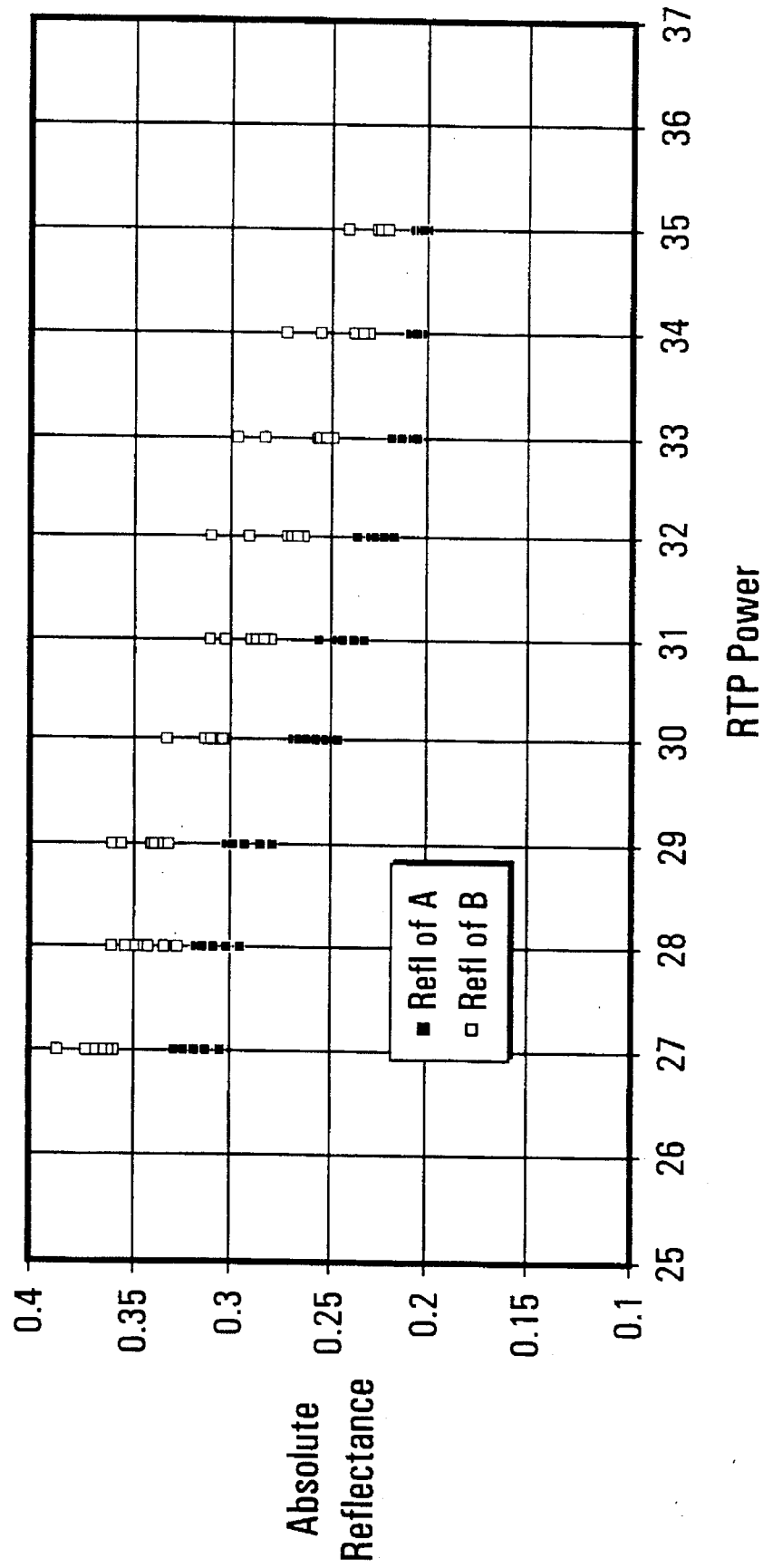
FIG. 1 is a graph of reflectance versus power.

FIG. 1 shows a graph of reflectance versus power. Reflectance is shown as a ratio of reflected radiation divided by incident radiation for wavelengths in the range of 290–310 nanometers. Power is measured in the percentage of the original intensity of a heat treatment lamp. FIG. 1 shows the results of testing on two different parts A, B. The graph in FIG. 1 demonstrates that power is inversely proportional to reflectance, and that as heat treatment goes up there is a corresponding decrease in reflectance. Stated otherwise, heat treatment is inversely proportional to reflectance and reflectance changes with temperature.

Figure 2:
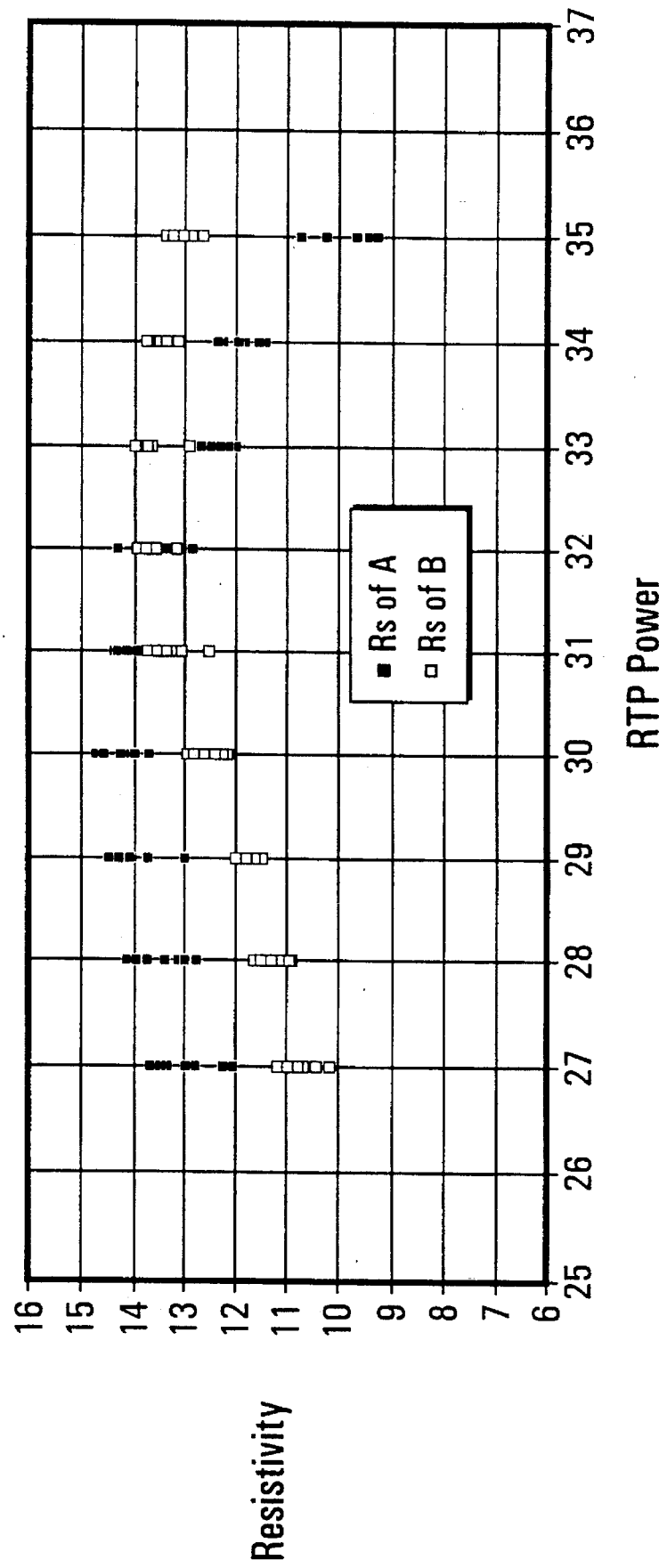
FIG. 2 is a graph that plots resistivity versus power.

FIG. 2 plots resistivity versus power for both an A part and a B part. Power is measured as in FIG. 1. Resistivity is measured in ohms per square to show sheet resistance. This graph depicts an environment of destructive testing and involves a contact method rather than a reflectance measurement method. Specifically, the entire semiconductor wafer is contacted in order to make the measurements depicted by FIG. 2.

Figure 3:
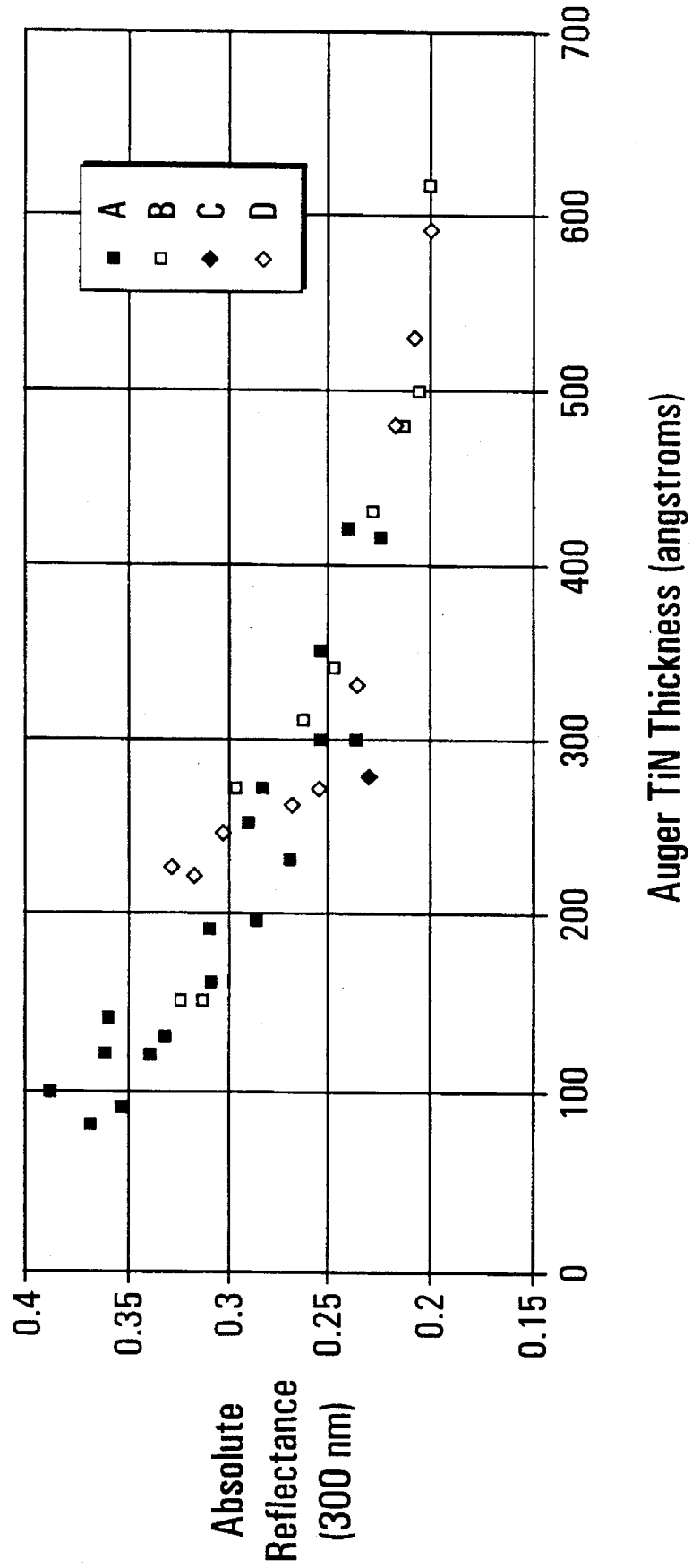
FIG. 3 is a graph of reflectance versus Auger TiN Film Thickness.

FIG. 3 shows a graph for parts A, B, C, and D of reflectance versus Auger TiN film thickness. Reflectance is measured as in FIG. 1 and is for radiation having a wavelength of approximately 300 nanometers. Auger TiN film thickness is measured in angstroms. FIG. 3 depicts the relationship that Auger TiN film thickness is inversely proportional to reflectance at 300 nanometers.

Figure 4:
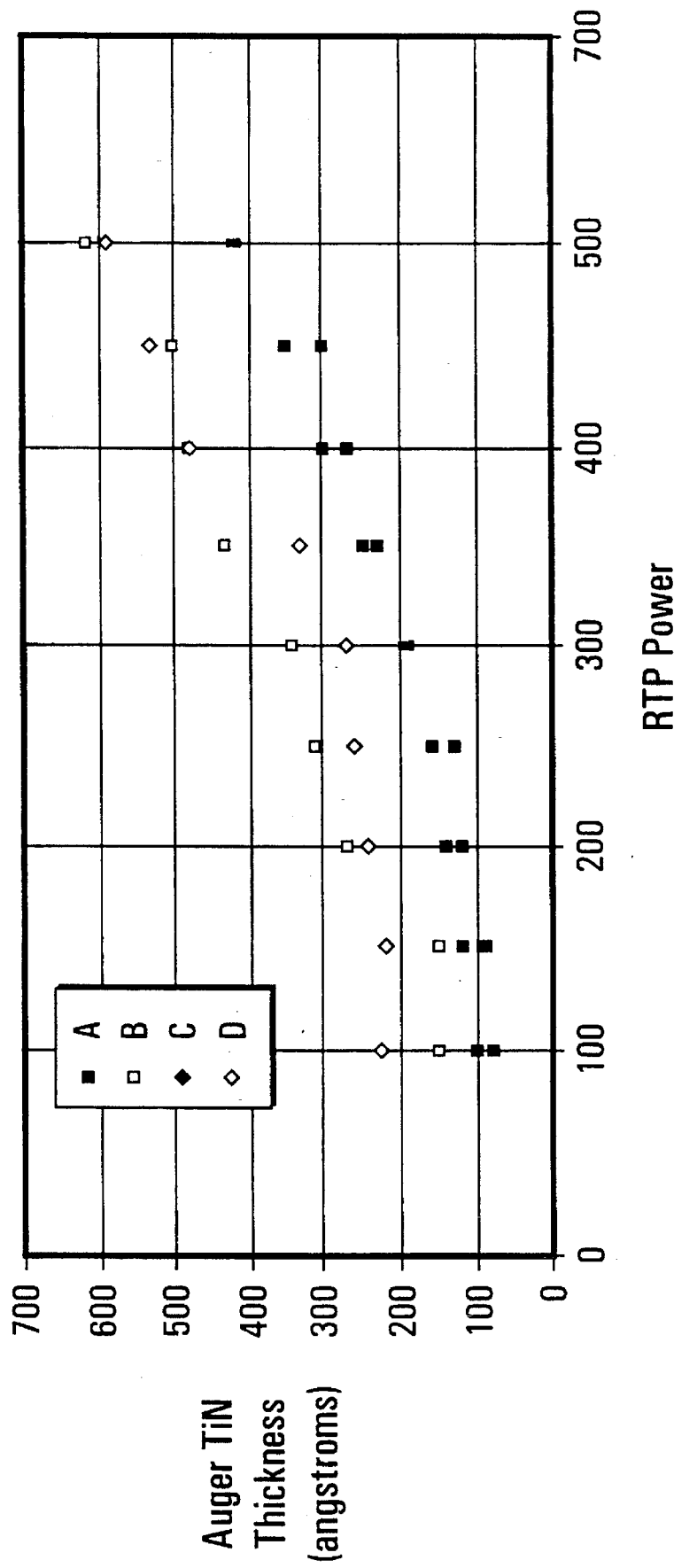
FIG. 4 is a graph of Auger TiN Film Thickness versus power.

FIG. 4 shows a graph for pans A, B, C, and D of Auger TiN film thickness versus power. Auger TiN film thickness is measured in angstroms and power is measured as in FIGS. 1 and 2. FIG. 4 shows the relationship that both power and temperature are proportional to the thickness of the TiN film.

Figure 5:
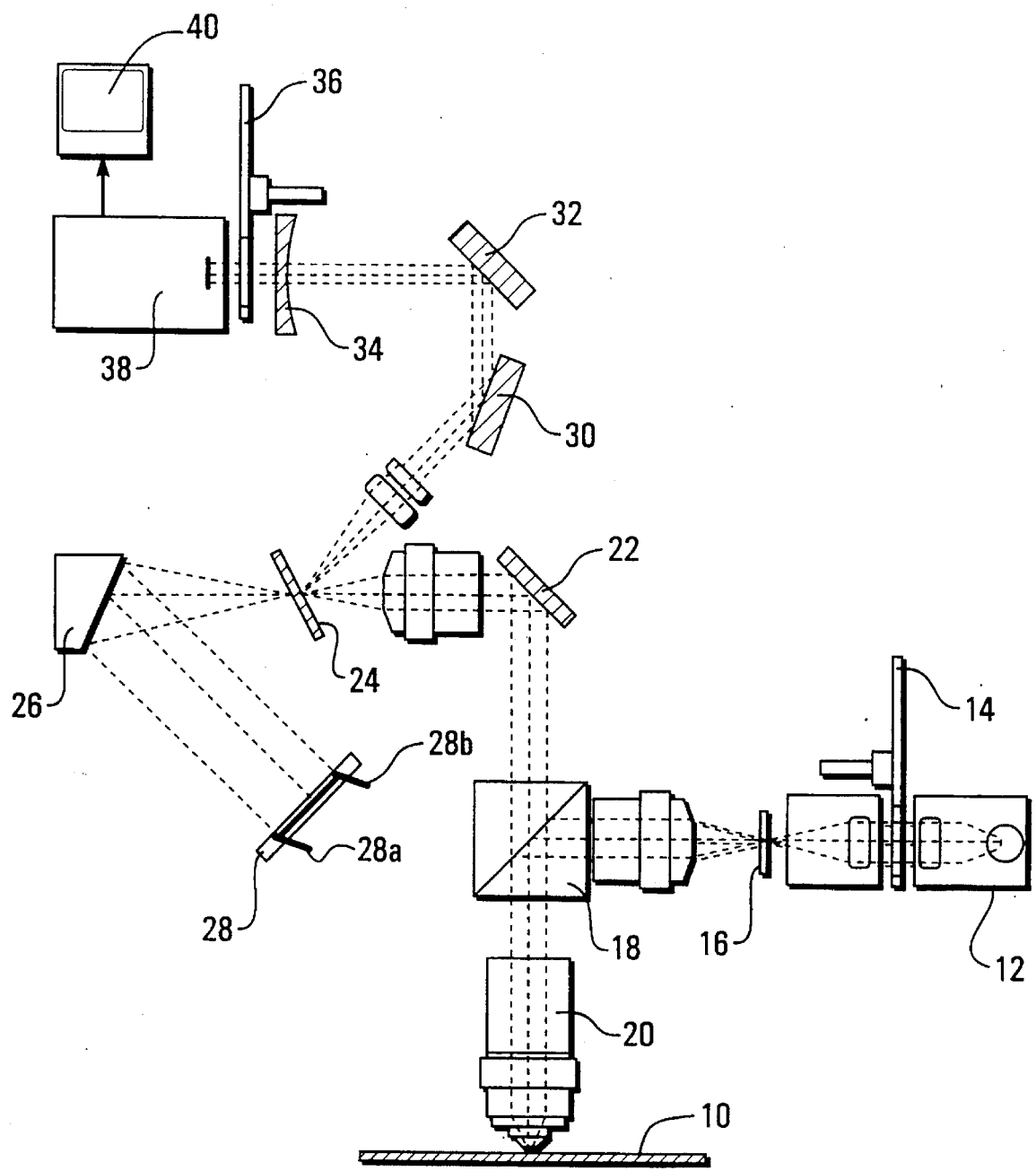
FIG. 5 is a depiction of a possible physical embodiment of practicing the invention in which an apparatus is used to take reflectance readings.

Depicted in FIG. 5 is a preferred physical embodiment of practicing the invention. The apparatus seen in FIG. 5 shows an optical path of a measurement instrument that is used to take reflectance readings. The measurement instrument may be used in situ for RTP environments.

In FIG. 5, a semiconductor wafer 10 is subjected to radiation. An optical path is initiated at a means for generating radiation, which by example and illustration is a lamp 12. From lamp 12, the optical path is routed to a wavelength filter 14 so that the optical path is followed by radiation of a preselected range of wavelengths. After wavelength filter 14, the optical path is focused upon and passes through a field stop 16 to beam splitter 18. Beam splitter 18 splits the radiation in the optical path by transmitting the optical beam to objective lens 20. The radiation in the optical path passes through objective lens 20 to cause an incident radiation beam at the preselected range of wavelengths upon wafer 10.

Incident radiation upon wafer 10 is reflected off the surface thereof so that the radiation reflected therefrom is routed back to beam splitter 18. The reflected radiation travels along the optical path through beam splitter 18 to be reflected off mirror 22. The radiation reflected off mirror 22 is bifurcated at an aperture plate 24 into dual optical paths.

The first optical path is directed towards a grating 26 and from thence to a solid-state radiation detector 28. Solid-state detector 28 has a 800 nanometer detection component 28a at one end thereof, and a 400 nanometer detection component 28b at an opposite end thereof. At solid-state detector 28, the reflectance of the radiation is measured.

The second optical path from aperture plate 24 is reflected to a mirror 30 for further reflection to another mirror 32, and from thence to projection lens 34. The radiation in the optical path then passes through both a projection lens 34 and a neutral density filter wheel 36. Neutral density filter wheel 36 further directs the radiation in the optical path to a camera 38 for transmission to a color monitor as indicated by block 40 in FIG. 5. The color monitor serves as an approximate visual representation of the reflectance measurements taken by solid-state detector 28.

Figure 6:
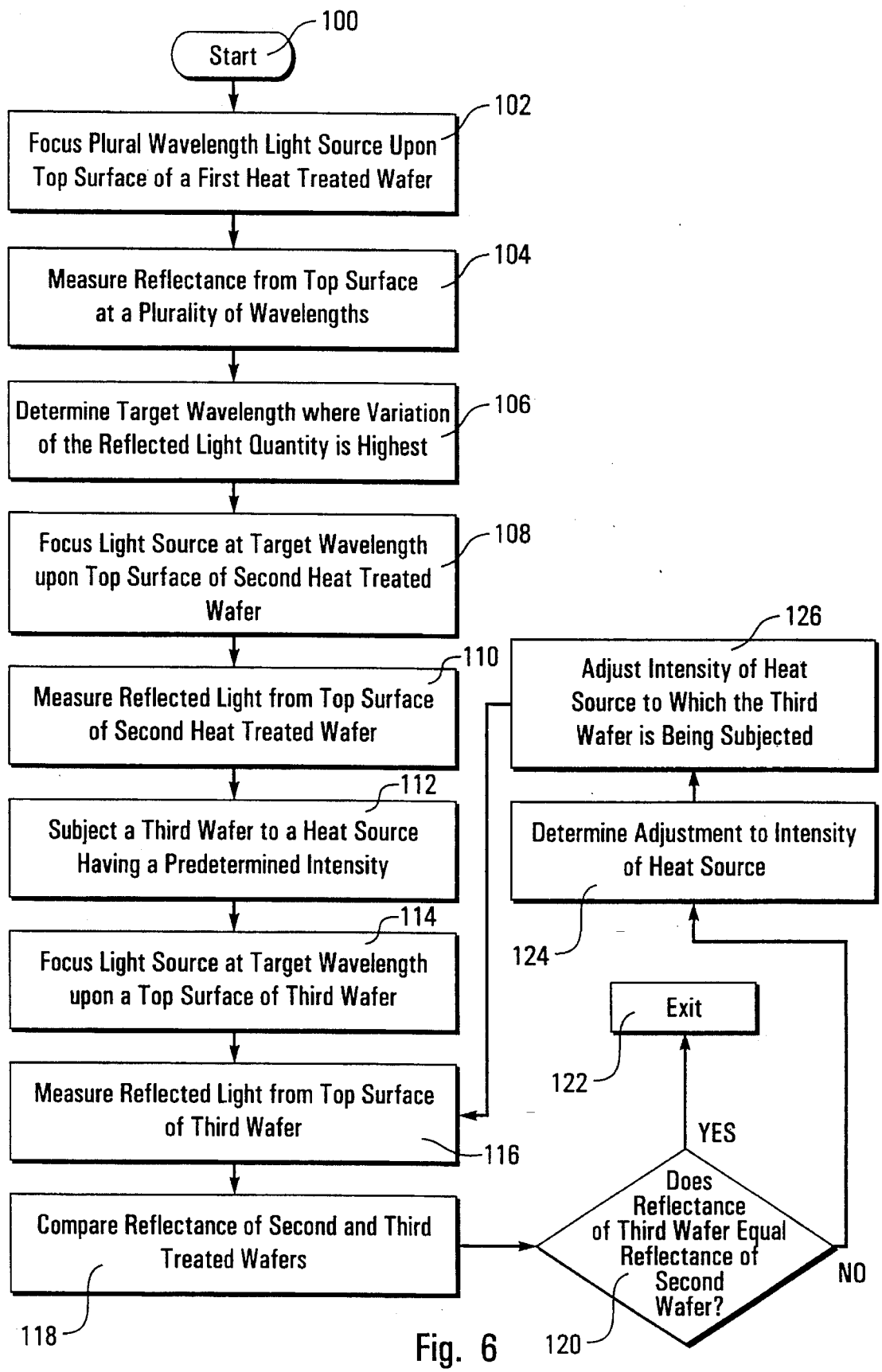
FIG. 6 is a block diagram of the inventive reflectance measurement process for accurate calibration of the RTP process showing various manipulative steps for developing calibration data for semiconductor wafers.

FIG. 6 is a block diagram of the inventive reflectance measurement process for accurate calibration of the RTP process and for assuring that wafers are heat treated according to a predetermined heat treatment status using a closed loop process control mechanism. Shown in FIG. 6 are various manipulative steps for developing calibration data for semiconductor wafers. Particularly, the method is directed to making reflectance measurements using the top surface of the semiconductor wafers.

After system initialization at step 100, step 102 begins where a light source is focused upon the top surface of a first wafer that has been heat treated. The light source has a plurality of predetermined wavelengths over which reflectance measurements are to be made. In step 104, such measurements are taken of the variation in the quantity of light at each of the predetermined wavelengths that is reflected off the top surface of the first wafer from the light source.

At step 106, a target wavelength is identified from among the plurality of predetermined wavelengths and is that wavelength at which the variation of the quantity of reflected light off the top surface of the first wafer is the highest variation.

In step 108, a light source of the target wavelength is focused on the top surface of a second heat treated wafer that has been heat treated to a predetermined state. Step 110 calls for measuring the quantity of light at the target wavelength that is reflected off the top surface of the second wafer.

Step 112 requires that a third wafer be subjected to a heat source having a predetermined intensity for the purpose of heat treating the third wafer. In step 114, a light source is focused upon the top surface of the third wafer. The focused light source is at the target wavelength. It is intended that this light source is to be focused while the third wafer is undergoing heat treatment from the heat source.

In step 116, light at the target wavelength that is reflected off the top surface of the third wafer is measured. In step 118, a comparison is made between the reflectance of light at the target wavelength off the top surfaces of the second and third wafers. In step 120, a query is made as to whether the reflectance off the third wafer equals that of the second wafer. If the reflectances are equal, then the process will terminate at step 122. However, if the reflectances are unequal, then the process moves to step 124 in which a determination is made as to a required adjustment to the heat source to which the third wafer is being subjected. In step 126, the determined adjustment is made to the heat source so as to better control the heat treatment of the third wafer. After the adjustment to the heat source, the process returns to step 116 to again measure the reflected light at the target wavelength from the top surface of the third wafer.

The process moves between steps 116 and 126 until the reflectance of light at the target wavelength from the top surface of the third wafer equals that of the second wafer. In this way, a closed loop process for controlling the heat treatment of the third wafer is achieved. Of course, other wafers can be tested and compared to the reflectance of the second wafer in a continuous process of wafer heat treatment testing. Additionally, the particular order of the steps to be performed can be rearranged, and such rearranged steps are contemplated as being within the scope of the invention.

What has been described is just one possible physical embodiment incorporating the invention. Variations to the described design, and entirely different designs using other and substitute components, could be employed to practice the invention.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of measuring a heat treatment status indicative of a heat treatment applied to a semiconductor wafer, the method comprising the steps of:

a) directing a light source having a plurality of predetermined wavelengths to a top surface of a first semiconductor wafer;

b) measuring the variation in the quantity of light at each of the predetermined wavelengths that is reflected off the top surface of the first semiconductor wafer from the light source;

c) determining a target wavelength from among the plurality of predetermined wavelengths at which the variation of the quantity of reflected light off the top surface of the first semiconductor wafer is the highest variation;

d) directing a light source of the target wavelength to a top surface of a second semiconductor wafer that has been heat treated to a predetermined heat treatment status indicative of a heat treatment applied to the second semiconductor wafer, the first and second semiconductor wafers being substantially similar in material and in geometry;

e) measuring the quantity of light at the target wavelength that is reflected off the top surface of the second semiconductor wafer;

f) directing a light source of the target wavelength to a top surface of a third semiconductor wafer, the second and third semiconductor wafers being substantially similar in material and in geometry;

g) measuring the quantity of light at the target wavelength that is reflected off the top surface of the third semiconductor wafer; and h) comparing the measured quantity of light that is reflected off the top surface of the second semiconductor wafer and the top surface of the third semiconductor wafer to determine whether there is substantially no difference between the measured quantity of light that is reflected off the top surface of the second semiconductor wafer and the measured quantity of light that is reflected off the top surface of the third semiconductor wafer as an indication that the third semiconductor wafer has a heat treatment status that is substantially the same as the heat treatment of the second semiconductor wafer.

2. The method as defined in claim 1, wherein the wavelength of substantially all of the plurality of predetermined wavelengths of the light source is at least 80 nm.

3. The method as defined in claim 2, wherein the wavelength of substantially all of the plurality of predetermined wavelengths of the light source is in the range of 250 nm to 800 nm.

4. The method as defined in claim 2, wherein the wavelength of substantially all of the plurality of predetermined wavelengths of the light source is not greater than 100 nm.

5. The method as defined in claim 1, wherein the first, second, and third semiconductor wafers are single crystal wafers.

6. The method as defined in claim 1, wherein the top surfaces of each of the first, second, and third semiconductor wafers are substantially planar.

7. The method as defined in claim 1, wherein the top surfaces of each of the first, second, and third semiconductor wafers are substantially non-planar.

8. The method as defined in claim 1, further comprising the step of placing the third semiconductor wafer in an RTP furnace having a heat source therein being directed at the third semiconductor wafer.

9. The method as defined in claim 8, further comprising the step of repeating the measuring and comparing steps for the third semiconductor wafer until there is substantially no difference between the measured quantity of light that is reflected off the top surface of the third semiconductor wafer and the measured quantity of light that is reflected off the top surface of the second semiconductor wafer.

10. The method as defined in claim 9, wherein the heat source is adjustable to a predetermined intensity, and wherein the step of repeating the measuring and comparing steps further comprises the step of adjusting the predetermined intensity of the heat source being directed at the third semiconductor wafer.

11. A method of deriving a heat treatment status of a production semiconductor wafer having a top surface, the method comprising the steps of:

a) focusing a light source having a predetermined wavelength on the top surface of the production semiconductor wafer;

b) measuring the quantity of light at the predetermined wavelength that is reflected off the top surface of the production semiconductor wafer from the light source;

c) comparing the measured quantity of light that is reflected off the top surface of the production semiconductor wafer to predetermined quantities of light at the predetermined wavelength that were reflected off the respective top surface of substantially similar semiconductor wafers from a substantially similar light source, the substantially similar semiconductor wafers having been subjected to varied heat treatments; and d) determining the heat treatment status for the production semiconductor wafer therefrom.

12. The method as defined in claim 11, wherein the respective top surfaces of each of the production semiconductor wafer and the substantially similar semiconductor wafers are diffuse in nature.

13. The method as defined in claim 11, wherein the respective top surfaces of each of the production semiconductor wafer and the substantially similar semiconductor wafers are specular in nature.

14. The method as defined in claim 11, further comprising the step of placing the production semiconductor wafer in a RTP furnace having a heat source therein being directed at the production semiconductor wafer, and wherein the heat source is adjustable to a predetermined intensity.

15. The method as defined in claim 14, further comprising the step of adjusting the predetermined intensity of the heat source being directed at the third semiconductor wafer while repeating the measuring, comparing, and determining steps for the production semiconductor wafer until the measured quantity of light that is reflected off the top surface of the production semiconductor wafer is substantially the same as a predetermined quantity.

16. A method of regulating heat treatment of a production semiconductor wafer having a top surface, the method comprising the steps of:

a) directing a heat source at a predetermined intensity at the production semiconductor wafer;

b) focusing a light source having predetermined wavelength on the top surface of the production semiconductor wafer;

c) measuring the quantity of light at the predetermined wavelength that is reflected off the top surface of the production semiconductor wafer from the light source;

d) comparing the measured quantity of light that is reflected off the top surface of the production semiconductor wafer to predetermined quantities of light at the predetermined wavelength that were reflected off the top surface of substantially similar semiconductor wafers from a substantially similar light source, the substantially similar semiconductor wafers having been subjected to varied heat treatments; and e) adjusting the predetermined intensity of the heat source being directed at the production semiconductor wafer while repeating the measuring and comparing steps until the measured quantity of light that is reflected off the top surface of the production semiconductor wafer is substantially the same as a predetermined quantity, thereby obtaining for the production semiconductor wafer a predetermined heat treatment of the varied heat treatments.

17. A method of regulating heat treatment of a production semiconductor wafer having a top surface, the method comprising the steps of:

a) directing a light source having a plurality of predetermined wavelengths to a top surface of a first semiconductor wafer;

b) measuring the variation in the quantity of light at each of the predetermined wavelengths that is reflected off the top surface of the first semiconductor wafer from the light source;

c) determining a target wavelength from among the plurality of predetermined wavelengths at which the variation of the quantity of reflected light off the top surface of the first semiconductor wafer is the highest variation;

d) directing a light source of the target wavelength to a top surface of a second semiconductor wafer that has been heat treated to a predetermined heat treatment status indicative of a heat treatment applied to the second semiconductor wafer, the first and second semiconductor wafers being substantially similar in material and in geometry;

e) measuring the quantity of light at the target wavelength that is reflected off the top surface of the second semiconductor wafer;

f) directing a heat source at the production semiconductor wafer;

g) directing a light source having the target wavelength on the top surface of the production semiconductor wafer;

h) measuring the quantity of light at the target wavelength that is reflected off the top surface of the production semiconductor wafer from the light source;

i) comparing the measured quantity of light that is reflected off the top surface of the production semiconductor wafer to the quantity of light at the target wavelength that is reflected off the top surface of the second semiconductor wafer; and j) repeating the measuring and comparing steps until the measured quantity of light that is reflected off the top surface of the production semiconductor wafer is substantially the same as the quantity of light at the target wavelength that is reflected off the top surface of the second semiconductor wafer as an indication that the production semiconductor wafer has a heat treatment status that is substantially the same as the heat treatment of the second semiconductor wafer.

18. The method as defined in claim 17, wherein both the heat source and the production semiconductor wafer are in a rapid thermal processing furnace, and wherein the heat source is an RTP lamp.

19. The method as defined in claim 17, wherein the heat source is a resistance heat source.

20. The method as defined in claim 17, wherein the heat source is a plasma heat source.

21. The method as defined in claim 17, wherein the heat source is a laser annealing heat source.

22. The method as defined in claim 17, wherein the wavelength of substantially all of the plurality of predetermined wavelengths of the light source is at least 80 nm.

23. The method as defined in claim 22, wherein the wavelength of substantially all of the plurality of predetermined wavelengths of the light source is in the range of 250 nm to 800 nm.

24. The method as defined in claim 22, wherein the wavelength of substantially all of the plurality of predetermined wavelengths of the light source is not greater than 100 nm.

25. The method as defined in claim 17, wherein the first, second, and production semiconductor wafers are single crystal wafers.

26. The method as defined in claim 17, wherein the respective top surfaces of each of the production semiconductor wafer, and the first and the second semiconductor wafers are substantially non-planar.

27. The method as defined in claim 17, wherein the respective top surfaces of each of the production semiconductor wafer, and the first and the second semiconductor wafers are substantially planar.

28. The method as defined in claim 17, further wherein the heat source directed at the production semiconductor wafer has an adjustable predetermined intensity, and wherein the step of repeating the measuring and comparing steps further comprises the step of adjusting the predetermined intensity of the heat source being directed at the production semiconductor wafer.

29. A method of regulating heat treatment of a production semiconductor wafer having a top surface, the method comprising the steps of:

a) directing a light source having a plurality of predetermined wavelengths to a top surface of a first semiconductor wafer, wherein the wavelength of substantially all of the plurality of predetermined wavelengths of the light source is in a range of at least one of:
  (1) about 80 nm to about 100 nm; and
  (2) about 250 nm to about 800 nm;

b) measuring the variation in the quantity of light at each of the predetermined wavelengths that is reflected off the top surface of the first semiconductor wafer from the light source;

c) determining a target wavelength from among the plurality of predetermined wavelengths at which the variation of the quantity of reflected light off the top surface of the first semiconductor wafer is the highest variation;

d) directing a light source of the target wavelength to a top surface of a second semiconductor wafer that has been heat treated to a predetermined heat treatment status indicative of a heat treatment applied to the second semiconductor wafer, the first and second semiconductor wafers being substantially similar in material and in geometry;

e) measuring the quantity of light at the target wavelength that is reflected off the top surface of the second semiconductor wafer;

f) directing an RTP lamp heat source at the production semiconductor wafer, the production semiconductor wafer being situated in a rapid thermal processing furnace, wherein the heat source has an adjustable predetermined intensity;

g) directing a light source having the target wavelength on the top surface of the production semiconductor wafer;

h) measuring the quantity of light at the target wavelength that is reflected off the top surface of the production semiconductor wafer from the light source;

i) comparing the measured quantity of light that is reflected off the top surface of the production semiconductor wafer to the quantity of light at the target wavelength that is reflected off the top surface of the second semiconductor wafer; and j) repeating the measuring and comparing steps while adjusting the predetermined intensity of the heat source being directed at the production semiconductor wafer until the measured quantity of light that is reflected off the top surface of the production semiconductor wafer is substantially the same as the quantity of light at the target wavelength that is reflected off the top surface of the second semiconductor wafer as an indication that the production semiconductor wafer has a heat treatment status that is substantially the same as the heat treatment of the second semiconductor wafer.

\* \* \* \* \*

UNITED STATES PATENT AND TRADEMARK OFFICE
CERTIFICATE OF CORRECTION

PATENT NO. : 5,618,461
DATED : April 8, 1997
INVENTOR(S) : Robert J. Burke, et al.

It is certified that error appears in the above-indentified patent and that said Letters Patent is hereby corrected as shown below:

Column 1, line 35, "to a " should read --to--

Column 3, line 34, "hem-treated" should read --heat-treated--

Signed and Sealed this

Twenty-fifth Day of November, 1997

*Attest:*

BRUCE LEHMAN

*Attesting Officer*     *Commissioner of Patents and Trademarks*